United States Patent
Bürger et al.

(10) Patent No.: US 8,088,227 B2
(45) Date of Patent: Jan. 3, 2012

(54) METHOD AND APPARATUS FOR THE TREATMENT OF OBJECTS, IN PARTICULAR FOR THE CLEANING OF SEMICONDUCTOR ELEMENTS

(75) Inventors: Norbert Bürger, Kirchzarten (DE); Mirko Löhmann, Furtwangen (DE); Richard Herter, Denzlingen (DE)

(73) Assignee: RENA GmbH, Gütenbach (DE)

( * ) Notice: Subject to any disclaimer, the term of this patent is extended or adjusted under 35 U.S.C. 154(b) by 685 days.

(21) Appl. No.: 11/886,208

(22) PCT Filed: Mar. 15, 2006

(86) PCT No.: PCT/DE2006/000468
§ 371 (c)(1), (2), (4) Date: Sep. 12, 2007

(87) PCT Pub. No.: WO2006/097087
PCT Pub. Date: Sep. 21, 2006

(65) Prior Publication Data
US 2008/0276959 A1   Nov. 13, 2008

(30) Foreign Application Priority Data
Mar. 15, 2005   (DE) .......................... 10 2005 012 244

(51) Int. Cl.
*B08B 3/12* (2006.01)
(52) U.S. Cl. ................. 134/1; 134/1.3; 134/15; 134/32; 134/61; 134/184
(58) Field of Classification Search ........................ None
See application file for complete search history.

(56) References Cited

U.S. PATENT DOCUMENTS

| | | | |
|---|---|---|---|
| 3,066,686 A * | 12/1962 | O'Neill ..................... | 134/122 R |
| 3,240,963 A | 3/1966 | Sasaki | |
| 4,979,994 A | 12/1990 | Dussault et al. | |
| 5,533,540 A * | 7/1996 | Stanasolovich et al. ...... | 134/155 |
| 5,709,235 A * | 1/1998 | Akanuma et al. ............. | 134/111 |
| 5,911,232 A * | 6/1999 | Mokuo et al. ................ | 134/184 |
| 6,276,370 B1 * | 8/2001 | Fisch et al. ..................... | 134/1.3 |
| 6,726,848 B2 * | 4/2004 | Hansen et al. ................ | 216/109 |

(Continued)

FOREIGN PATENT DOCUMENTS

DE    1 078 406    9/1962

(Continued)

OTHER PUBLICATIONS

Grundlagen et. al., Ultraschalltechnik,1987: 22-23.

*Primary Examiner* — Michael Kornakov
*Assistant Examiner* — Ryan Coleman
(74) *Attorney, Agent, or Firm* — Biotech Beach Law Group PC

(57) ABSTRACT

The invention relates to the continuous cleaning of objects, in particular of semiconductor elements, using ultrasound, wherein the objects to be cleaned are arranged within a liquid. Furthermore, the present invention relates to an apparatus for carrying out the method according to the invention.
A basic idea of the invention is that the surface of an object to be cleaned (2) in a tank (5) filled with liquid passes through at least one oscillation maximum that is emitted by at least one sound source (8a) being present in the tank (5). According to one embodiment, the sound source fields (8) that are positioned within the tank (5) are arranged inclined with respect to the transport direction (4).

12 Claims, 2 Drawing Sheets

U.S. PATENT DOCUMENTS

2004/0168706 A1  9/2004  Boyd et al.

FOREIGN PATENT DOCUMENTS

| DE | 197 22 423 C2 | 12/1997 |
| EP | 0 447 178 A1 | 9/1991 |
| EP | 0 936 663 A2 | 8/1999 |
| GB | 819807 | 9/1959 |
| JP | 2001-170583 | 6/2001 |
| JP | 2001-170583 A | 6/2001 |
| JP | 2001-340820 | 12/2001 |
| JP | 2001-340820 A | 12/2001 |
| JP | 2003-270724 | 1/2005 |
| WO | WO 03/086913 A1 | 10/2003 |

* cited by examiner

METHOD AND APPARATUS FOR THE TREATMENT OF OBJECTS, IN PARTICULAR FOR THE CLEANING OF SEMICONDUCTOR ELEMENTS

CROSS REFERENCE TO RELATED APPLICATIONS

This is a National Phase Application in the United States of America of International Patent Application No. PCT/DE2006/000468, filed Mar. 15, 2006, which claims priority to German Patent Application DE 10 2005 012 244.2, filed Mar. 15, 2005. The entire disclosures of the above patent applications are herein incorporated by reference in their entirety.

FIELD OF INVENTION

The invention relates to the cleaning of objects, in particular of semiconductor elements, using ultrasound, wherein the objects to be cleaned are arranged within a liquid. Furthermore, the present invention relates to an apparatus for carrying out the method according to the invention.

BACKGROUND OF THE INVENTION

In general, the cleaning with ultrasonic waves is well known. Ultrasonic cleaning is mainly being used in industrial piece-part production and employed especially in electrical engineering, in precision mechanics, in metal working, or also in the production of circuit boards. Other typical fields of application for this type of object cleaning can be found in photo industry as well as in medical technology. The use of ultrasonic waves serves to particularly remove dirt particles from objects, and is suggested when the impurities can only inadequately be reached and removed with mechanical cleaning devices such as, for example, brushes or polishing means.

For the ultrasonic cleaning according to methods known in the art as well as according to the method of the present invention it is necessary that the object to be cleaned is arranged within a liquid, so that the sound waves that are emitted from an ultrasonic generator using suitable ultrasonic oscillators can be transmitted via the liquid medium onto the object to be cleaned. So-called sound source fields emit the sound that impinges on the object to be cleaned.

Especially during a semiconductor production process different cleaning steps are necessary in order to remove dirt particles as well as particles that are formed during processing from the semiconductors, e.g. from wafers or disks. These particles that particularly originate from the mechanical processing of the semiconductor elements (substrates), such as e.g. from sawing, can be sawing particles that consist of the substrate's material. Also, a so-called "slurry" or abrasive powder emulsion is often used. This slurry comprises silicon carbide or aluminium oxide in a glycol or oil containing mixture. These impurities (motes, particles, remainders of organic compounds, etc.) must be removed in one or several cleaning steps in order to ensure the desired product characteristics.

Methods are known in the prior art in which the objects to be cleaned, such as for example wafers or disks, are first sorted into carriers. Subsequently, these are either manually or automatically submerged into tanks containing a suitable liquid, wherein the carriers are stationary fixed or, alternatively, moved within the cleaning tank either by a handling system or manually.

In order to achieve a better cleaning result, mostly several different tanks are provided, such as e.g. 10 to 20 tanks, which have different liquids and/or different sound sources. The sound sources themselves emit with different frequencies, so that in the individual tanks, different cleaning results can be achieved.

In order to support the cleaning effect the tanks are mostly operated warm, wherein the temperature is usually adjusted between 30° C. and 60° C. The frequencies lie in the ultrasonic range and are emitted by sound sources which are commonly located at the bottom as well as partly on the walls of the cleaning tanks. Alternatively or additionally, so-called submersion oscillators are used, which preferably are located at those places of the cleaning tank where one expects the realization of a uniform as possible distribution of the sound waves within the cleaning bath. According to a preferred alternative of the prior art the submersion oscillator(s) is/are provided as plate oscillator(s) and mostly placed below the objects to be cleaned. The plate oscillators are normally used for large-area parts in order to ensure that the sound waves reach the entire object.

The typical total time of such a cleaning process including drying approximately amounts to one hour and mostly requires several manual or mechanically assisted relocation steps, resulting in relatively high breaking rates. Thus, and in particular in view of the processing of future wafers with an edge length of 200 mm and a width of less than 200 µm, there is a need for alternative cleaning methods by which the objects to be cleaned can be treated quicker, cheaper, and more gently.

U.S. Pat. No. 4,979,994 discloses a method and an apparatus for the cleaning of printed circuit boards, where the printed circuit board is treated in a liquid by sound. In order to ensure that the cleaning also takes place in the space that is located between the electrical components and the printed circuit board, the orientation of the sound source fields is inclined, i.e. by an angle between −60 and +60 degrees to the vertical of the printed circuit board. These undercuts shall then be reached by reflection. The respective sound source field and the acoustically irradiated printed circuit board remain stationary with respect to each other.

DE-C 1 078 406 discloses an apparatus for the cleaning of metals by ultrasound. The device consists of a rotating drum that is funnel-shaped. A sound source field, whose position is adjustable along the circumferential surface of the drum, is arranged stationary.

DE 192 22 423 C2 discloses an apparatus for treating substrates, in particular semiconductor wafers. These substrates are mounted in a fluid tank on a bar-shaped carrier element. In order to achieve a better cleaning yield, the carrier element together with the substrate can be elevated and lowered, so that the distance between sound source field and substrate can optionally be larger or smaller.

OBJECT OF THE INVENTION

The object of the present invention is to provide a method and/or an apparatus for sonically cleaning in particular fragile objects.

Solution

A basic idea of the invention is to provide a method as well as an apparatus which are designed to ensure that at least one oscillation maximum impinges on the surface of an object to be cleaned in a cleaning tank, wherein said oscillation maximum is emitted by at least one sound source being present in the tank. This oscillation maximum corresponds to the so-called antinode.

Accordingly, a method according to claim 1 and/or an apparatus according to claim 2 are provided.

According to the invention, the aspects can be realized using different means as set forth below. A common characteristic of these alternative embodiments is that a respective oscillation maximum with maximum amplitude impinges on the object to be cleaned. For this purpose, the mechanical distance between a sound source and the object to be treated must preferably be adjusted to a few millimetres precision. This coupling of the ultrasound into the liquid of the cleaning tank, which is optimized versus the prior art, is equally ensured in all embodiments.

The typical wavelengths $\lambda$ of ultrasound in liquid range between 10 mm and 80 mm, wherein the frequencies are between 20 kHz and 132 kHz and the liquid is water (example: for a frequency of 25 kHz, the wavelength in water is approximately 59 mm.)

Preferably, the sound sources are arranged as so-called sound source fields. Herein below, the term sound source fields designates such arrangements that consist of several oscillation sources which, at least as such, emit in-phase. In particular, such sound source fields can be plate oscillators with planar surfaces.

Besides the elimination of the drawbacks of the prior art as mentioned above, an essential advantage of the invention according to a preferred embodiment is that the cleaning of objects can be carried out continuously without the need of a manual or automatic rearrangement or resorting.

According to the invention, this can advantageously be achieved by transporting the object to be cleaned through a liquid by means of a transportation device. An example for such a transportation system is disclosed in WO 2003/086913 A1. During its transport, the object is passed along a sequence of differently adjusted sound sources, wherein these sound sources are arranged within the cleaning liquid and emit frequencies in the ultrasonic range. Due to the exact spatial correlation between a sound source field and the surface of the object to be cleaned, that is realized in the alternative embodiments, it is ensured that the sound waves impinge on the object to be cleaned with their oscillation maxima. This can be effected directly or indirectly, as shown below.

Mechanically, it is possible to arrange a sound source field within a liquid-filled tank in a defined distance with respect to the object to be cleaned.

However, the composition and the temperature of the liquid as well as other internal parts that are provided for inside the tank, and also possible reflections at the objects to be cleaned usually result in differences by which a given antinode is displaced. Thus, and despite optimal mechanical conditions, the uncertainty exists that it cannot be guaranteed that at least one antinode of a sound wave impinges on the object to be cleaned with a maximum amplitude.

According to a first aspect of the invention, the individual sound source fields, along which the object to be cleaned is passed preferably via the transportation device, are not arranged in parallel with the transport direction, but inclined. In this case, inclined means that the sound source field with its surface is not oriented in parallel with the plane that is defined by the object to be cleaned, but that a defined inclination exists between the plane of the sound source field and the plane of the object to be cleaned. Here, the inclination is independent of the transport direction. This means that the inclination can be in-line with the transport direction, i.e. that the distance between the sound source field and the plane of the object to be transported increases, or vice-versa.

According to the invention, it is suggested in a continuative embodiment, that more than one sound source field is arranged while the object is transported through the tank. It may be provided that these can be driven by different frequencies. Preferably, the individual sound source fields that are driven by the same frequency are separated from each other by tank separators. In the beginning of the first cleaning step, it is proposed to start with a low frequency (e.g. 25 kHz) in order to remove coarse and larger particles. Depending on the actual nature of the task, it is preferred to gradually use higher frequencies (e.g. 40 kHz or higher) in transport direction, so that coarse particles in the starting region up to very fine particles in the terminating region are successively removed in a continuous manner. These frequencies can range up to the megasound band, with the megasound band using frequencies from 800 kHz up to 2 MHz. Therein, the inclinations of the individual sound source fields as well as their distance to the plane of transport of the object to be cleaned can vary.

In order to obtain a good cleaning result and to solve the task that at least one oscillation maximum impinges on the object that is passed along the sound source field, it is proposed according to the invention that the inclination of the sound source field against the plane of transport of the object is clearly smaller than $\lambda/2$, wherein $\lambda$ is the emitting wavelength of the sound source field. It turned out to be advantageous to adjust the theoretical position of the antinode over the center of the oscillation field and to incline the entire sound source field to a value clearly less than $\lambda/2$. An exceptionally effective cleaning result is obtained when the inclination of the sound source field with respect to the plane of transport of the object is $\lambda/4$ or even $\lambda/8$. If the sound source field is arranged in parallel, the inclination of the same can, if necessary, alternatively be obtained by provision of a focusing reflection surface that is arranged between the field and the object to be treated in such a manner that the sound waves exhibit the above described propagation characteristic. A further alternative of this embodiment with the sound source fields being horizontally oriented is to at least temporarily transfer the objects to be cleaned from their horizontal position into an inclination.

According to a further embodiment, the inclined sound source fields are at least partially guided in parallel with the plane of transport and thus moved in relation to the transport direction.

According to a further aspect of the present invention, the inventive principle as set forth above can also be realized by a horizontal arrangement of the sound source fields in parallel with the plane of transport, as long as the sound source fields are movable and allow for a relative movement with respect to the object. In practice, the possibility of modifying the position of a horizontally oriented sound source field in relation to the cleaning object results in that, in the course of the movement, the antinode of a sound wave at least once impinges on the object to be treated with maximum amplitude.

Thus, according to a preferred embodiment, the sound source fields are movable and arranged in parallel with the transport direction of the objects to be cleaned, wherein the movement is effected vertically (perpendicular) to the transport direction.

In order to achieve a more homogenous cleaning, the movement according to another embodiment can advantageously be effected vertically (perpendicular) and horizontally (parallel) to the transport direction, wherein the vertical and horizontal movement can be carried out sequentially or simultaneously.

According to another embodiment, a combination of the previously disclosed embodiments is provided. This means that a three dimensional movement of the sound source fields takes place. According to a preferred combination, the sound source fields are e.g. movable and arranged inclined with respect to the transport direction of the objects to be cleaned, wherein the movement is effected either vertically or vertically and horizontally with respect to the transport direction. Also by this combinatory approach, it is ensured that at least one oscillation maximum impinges on the object to be cleaned.

In the already mentioned embodiment of the invention, according to which the sound source fields are moved relatively to the object to be cleaned in parallel with the transport direction or plane, it is advantageous that the relative movement is carried out slowly in order to establish an as much as possible stable sound field. Here, the typical amplitude being perpendicular to the transport direction is clearly smaller than $\lambda/2$, wherein $\lambda$ is the emitting wavelength of the sound source fields. According to a particularly preferred embodiment the amplitude measured perpendicular to the transport direction is $\lambda/4$. During the stay of an object to be cleaned within the tank, this amplitude must be passed through at least once.

According to an embodiment of the present invention, the objects are placed onto a transportation device, e.g. a roller transportation system. Here, the objects are transported by aid of several transport rollers that are arranged one after another and oriented horizontally. The individual transport rollers are arranged within a fluid in such a manner that the respective upper edge of the rollers is positioned approximately at the level of the fluid surface, i.e. the upper border of the fluid, so that the lower side of the respective object is wetted by direct contact with the fluid surface. Here, a meniscus can form at the edges of the object. An interaction of gravity and surface tension then pulls the object down and results in the object remaining in contact with the rollers without floating. By this, the roller conveyor system enables to transport the objects in a controlled and defined manner.

According to a particularly preferred embodiment, the transport roller comprises at least two support elements that can advantageously be arranged on the transport roller in the region of two grooves. The distance between the support elements is determined by the width of the object to be treated. In the region of the sound source field it is aspired that the object to be cleaned has sufficient space. Therefore, the guiding elements, in particular in this region, are spaced further apart, and the holding-down means that are arranged opposite to the transport rollers and enclose the object to be cleaned have a larger freedom of motion, so that forces which might occur can be diverted from the object. With this, the objective is reached to exert as little force as possible onto the good to be cleaned. In this manner, the rate of breakage is significantly reduced.

The transport roller is preferably constructed at least two-part and consists of a spindle element and at least one track element surrounding the spindle element. In the region of the sound source fields the spindle elements of the individual transport rollers are spaced further apart from each other, so that the sound that is emitted from the sound source fields can better impinge on the object to be cleaned. The spindles consist of a material that only slightly impedes the sound in its propagation.

According to another aspect of the present invention an apparatus is provided to carry out the method according to the invention. The essential characteristics of this apparatus arise from the above information regarding the process control and are summarized in claim 2.

Besides the advantages already mentioned, the carrying out of the method according to the invention results in a significant reduction of the processing time compared to known methods. It could be demonstrated according to the invention that the common processing time of approximately one hour can be reduced to approx. 10 minutes.

Another essential advantage of the invention is that the common use of chemicals in the cleaning bath can be omitted when performing the method according to the invention. Furthermore, the invention enables to adjust the temperature of the cleaning liquid to room temperature, i.e. to a value between approx. 15° C. and approx. 25° C., without having to fear deterioration of the outstanding cleaning result that is achieved according to the invention.

According to an alternative, partly demineralised or deionised water can be used as cleaning medium.

In this context, however, it is explicitly indicated that the application of common temperatures and/or the use of chemical agents in the cleaning liquid is naturally included according to the invention.

Further advantages arise from the following description, the drawings as well as from the claims.

DRAWINGS

DESCRIPTION OF AN EXEMPLIFYING EMBODIMENT

Figure 1:
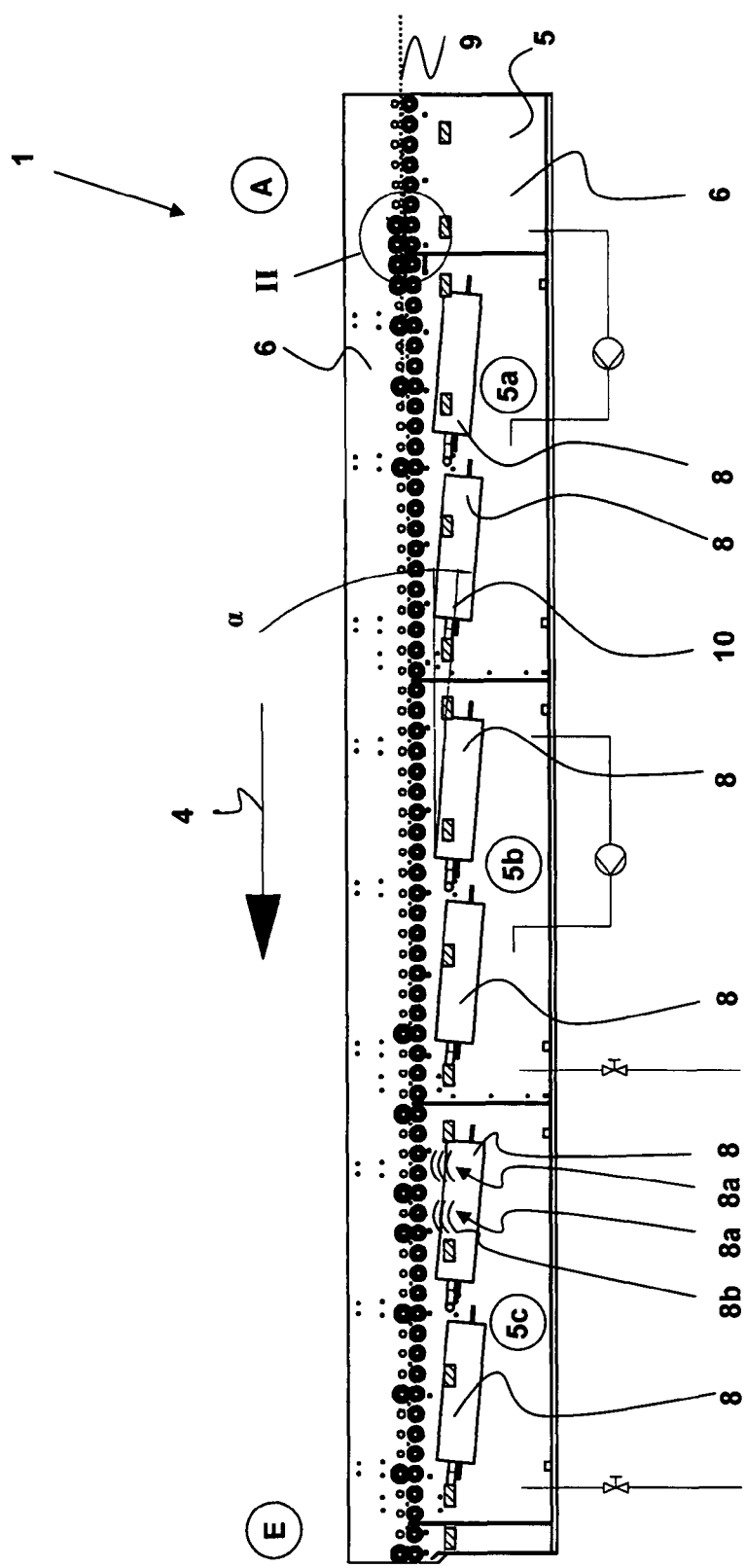
FIG. 1 shows a schematic representation of an apparatus for the cleaning of objects, in particular of semiconductor elements in the form of wafers or disks, respectively, for carrying out the method according to the invention.

FIG. 1 schematically shows an apparatus 1 according to the invention for the cleaning of objects 2, in particular of wafers in the form of discs.

Figure 2:
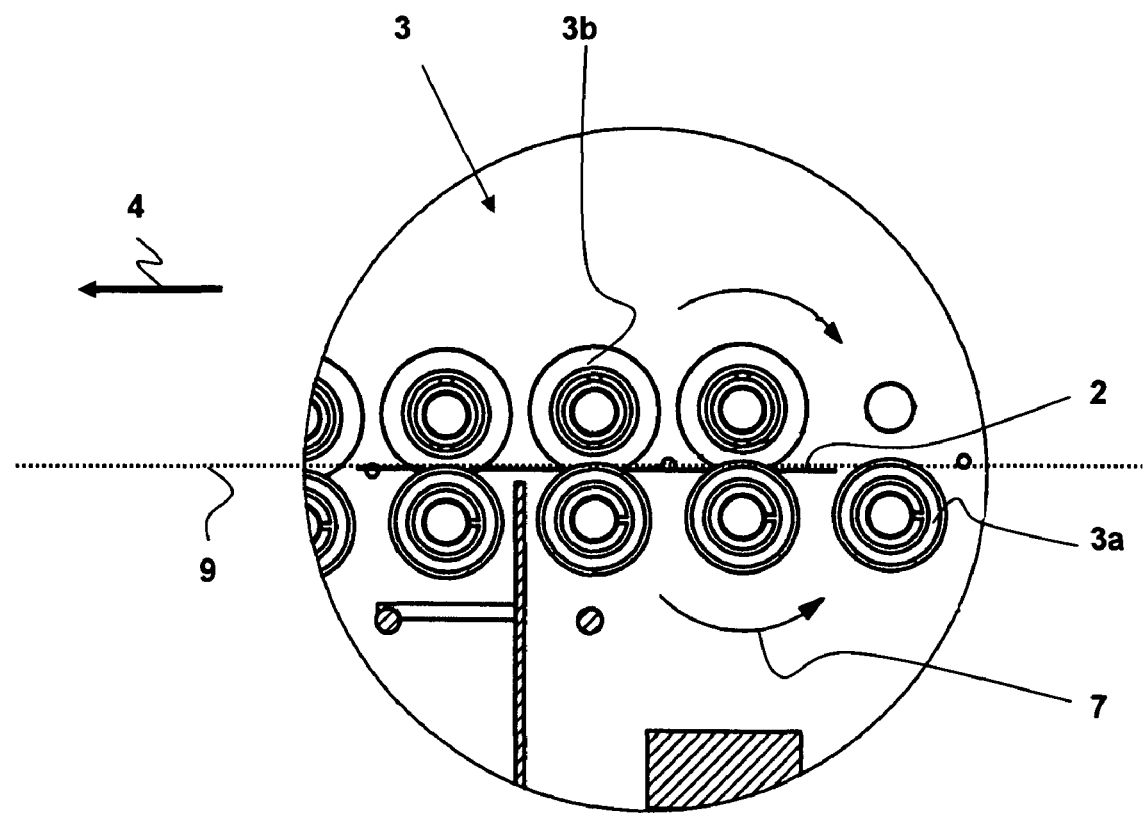
FIG. 2 shows a partial view of FIG. 1 and serves to clarify the transport of the object to be cleaned.

The objects 2 are moved by the transportation device 3 in transport direction 4 through a tank 5. The tank 5 is filled with a liquid 6. The transportation device 3 itself preferably consists of driving rollers 3a and holding-down means 3b (FIG. 2), wherein the driving rollers 3a, due to their rotary motion in direction of arrow 7, serve to drive the objects 2 in transport direction 4. The holding-down means 3b that rotate in counter-movement serve to ensure that the objects 2 do not float in liquid 6.

The tank 5 is divided into different regions, in so-called segments 5a, 5b, 5c. All segments 5a, 5b, 5c can fluidically be interconnected and are served via the transportation device 3. For the exemplifying embodiment depicted here, at least one sound source field 8 is arranged within each segment 5a, 5b, 5c. This sound source field 8 emits from its sound source 8a sound 8b in the direction of the respective objects 2 that are arranged above the sound source field. Due to the liquid 6 that surrounds the respective sound source fields 8, the sound that is generated by the sound source field 8 is coupled into the liquid and transferred onto the object 2.

According to another exemplifying embodiment not being depicted in detail, also one or more sound source fields 8 can be arranged within the segments.

The segments 5a, 5b, 5c are not absolutely necessary, neither for carrying out the method according to the invention nor for the apparatus. They merely serve to define the individual regions more easily and to specify different cleaning regions. According to the invention, also the number of the segments depicted is not fixed and can be chosen freely in consideration of the actual requirements.

Within the segments 5a, 5b, 5c, the sound source fields 8 are arranged in such a manner that they are not aligned parallel to the transport direction 4, but exhibit an inclination. This means that they are arranged inclined with respect to the transport direction 4, wherein the inclined arrangement in principle can be effected in both directions (in-line or opposite to the transport direction, respectively). Due to this inclined arrangement, an angle $\alpha$ is formed between the horizontal plane 9 in transport direction 4 and the plane 10 of the respective sound source field 8. This defined inclination preferably is smaller than λ/2, wherein λ is the wavelength in which the sound source field 8 emits the generated sound.

In the present exemplifying embodiment the sound source field 8 is arranged stationary within the respective segments 5a, 5b, 5c.

Method

The individual objects 2, here exemplarily in the form of even or flat wafers, respectively, are fed at a first sector A in the transportation device 3 (or handed over from another processing step), and moved by the transportation device 3 (transport rollers 3a as well as holding-down means 3b) in transport direction 4. Subsequent to an appropriate start-up phase, the object to be cleaned 2 reaches a first sector 5a and passes over a first sound source field 8. During passing over and due to the arrangement of the sound source field 8 according to the invention, at least one antinode impinges on the surface of the object with maximum amplitude. Continuously, the object 2 is transferred from this segment 5a to the subsequent segment 5b and so on. The procedure is repeated above each sound source field 8.

For the method as well as for the apparatus 1 depicted here, the individual sound source fields 8 are placed in individual segments 5a, 5b, 5c, and preferably arranged in such a manner that the frequency within the apparatus according to the invention increases stepwise or linearly from one sound source field 8 to the next. At the end E of the apparatus according to the invention, the cleaned object that was treated in the continuous process can be unloaded or transferred to another facility.

REFERENCE LIST

1 Apparatus
2 Objects (wafers)
3 Transportation device
3a Transport roller
3b Holding-down means
4 Transport direction
5 Tank
5a Segment
5b Segment
5c Segment
6 Liquid
7 Arrow (rotation direction)
8 Sound source field
8a Sound source
8b Sound
9 Plane (plane of transport, plane of transport direction 4)
10 Plane (of the sound source field 8)
A Beginning (first sector)
E End
α Angle
λ Wavelength

The invention claimed is:

1. Method for the sonic treatment and cleaning of objects in a tank (5) that is equipped with liquid (6) and at least one sound source field (8), wherein the objects (2) are continuously transported on a transportation device (3) through the tank (5) and over the at least one sound source field (8), wherein the at least one sound source field (8) comprises several oscillation sources tuned to emit sound (8b) in-phase into the liquid (6) to impinge on objects with its oscillation maximum, further wherein the at least one sound source field (8) is arranged:
   I. inclined less than Lambda/2 with respect to the plane of the object to be cleaned (2), wherein Lambda designates the wavelength of the sound (8b) emitted; or
   II. movable and parallel to the plane of the object to be cleaned (2), wherein the movement is carried out either vertically or vertically and parallel to the plane of the object to be cleaned (2);
   thereby ensuring that the sound (8b) impinges on the surface of the object (2) with at least one oscillation maximum.

2. Apparatus for the sonic treatment and cleaning of objects (2) comprising a tank (5) that is equipped with liquid (6), at least one sound source field (8), and a transportation device (3) for continuous transportation of the objects (2) through the tank (5) and over the at least one sound source field (8), wherein the at least one sound source field (8) comprises several oscillation sources tuned to emit sound (8b) in-phase into the liquid (6) to impinge on objects with its oscillation maximum, further wherein the at least one sound source field (8) is arranged:
   I. inclined less than Lambda/2 with respect to the plane of the object to be cleaned (2), wherein Lambda designates the wavelength of the sound (8b) emitted; or
   II. movable and parallel to the plane of the object to be cleaned (2), wherein the movement is carried out either vertically or vertically and parallel to the plane of the object to be cleaned (2);
   thereby ensuring that the sound (8b) impinges on the surface of an object (2) with at least one oscillation maximum.

3. Apparatus according to claim 2, comprising a multitude of sound source fields (8) each comprising several oscillation sources, further wherein the multitude of sound source fields (8) are arranged sequentially one after another in transport direction (4).

4. Apparatus according to claim 3, characterized in that the multitude of sound source fields (8) emit different frequencies.

5. Apparatus according to claim 4, characterized in that the frequencies emitted by the multitude of sound source fields (8) are increasing in transport direction (arrow 4).

6. Apparatus according to claim 5, characterized in that the transportation device (3) comprises transportation elements for loading of the objects (2), that extend perpendicular to the transport direction (4) and are arranged in a distance from each other.

7. Apparatus according to claim 3, characterized in that the multitude of sound source fields (8) have the same inclination α with respect to the plane of the object to be cleaned.

8. Apparatus according to claim 3, characterized in that the multitude of sound source fields (8) have different inclinations α with respect to the plane of the object to be cleaned.

9. Apparatus according to claim 2, characterized in that the temperature of the liquid (6) is between 15° C. and 25° C.

10. Apparatus according to claim 9, characterized in that the temperature of the liquid (6) within the tank is room temperature.

11. Apparatus according to claim 6, characterized in that the transportation elements comprise transport rollers that, for transportation of the object to be cleaned (2) in the vicinity of the multitude of sound source fields (8), are, in comparison with the remainder of the transportation device (3), spaced further apart from each other.

12. Apparatus according to claim 6, characterized in that the transportation elements comprise transport rollers as well as, at least partially, holding-down means.

* * * * *